(12) United States Patent
Yamaguchi et al.

(10) Patent No.: US 7,839,484 B2
(45) Date of Patent: Nov. 23, 2010

(54) EXPOSURE APPARATUS AND EXPOSURE METHOD, AND METHOD OF MANUFACTURING ELECTRICAL WIRING BOARD

(75) Inventors: Yoshihide Yamaguchi, Yokohama (JP); Masakazu Kishi, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 462 days.

(21) Appl. No.: 11/492,790

(22) Filed: Jul. 26, 2006

(65) Prior Publication Data

US 2007/0024838 A1 Feb. 1, 2007

(30) Foreign Application Priority Data

Jul. 27, 2005 (JP) ............................. 2005-217330

(51) Int. Cl.
G03B 27/42 (2006.01)
(52) U.S. Cl. .......................................... 355/53; 355/30
(58) Field of Classification Search .................. 355/53, 355/30; 250/492.1, 492.2
See application file for complete search history.

(56) References Cited

U.S. PATENT DOCUMENTS

| | | | | |
|---|---|---|---|---|
| 5,229,872 A | * | 7/1993 | Mumola | ......................... 349/2 |
| 6,437,348 B1 | * | 8/2002 | Spence | ..................... 250/492.2 |
| 6,646,274 B1 | * | 11/2003 | Bleeker | ................... 250/492.2 |
| 6,841,340 B2 | * | 1/2005 | Tani | ........................... 430/320 |
| 2003/0210383 A1 | * | 11/2003 | Bjorklund et al. | ............. 355/53 |

FOREIGN PATENT DOCUMENTS

| | | |
|---|---|---|
| JP | 2002-182157 | 6/2002 |
| JP | 2003-015077 | 1/2003 |
| JP | 2004-039871 | 2/2004 |
| JP | 2004-085728 | 3/2004 |
| JP | 2004-157219 | 6/2004 |

\* cited by examiner

*Primary Examiner*—Edward J Glick
*Assistant Examiner*—Mesfin T Asfaw
(74) *Attorney, Agent, or Firm*—Antonelli, Terry, Stout & Kraus, LLP.

(57) ABSTRACT

This invention provides: an exposure apparatus and exposure method based on a maskless exposure technique which uses a two-dimensional optical modulator, in which maskless exposure technique, the exposure apparatus and exposure method employ a first irradiation source optics for drawing a pattern based on exposure pattern data, and a second irradiation source optics for irradiating an energy ray onto a desired area of space on a region inclusive of a region in which the pattern has been drawn; and a method of manufacturing a wiring Substrate (Board); thus, highly accurate pattern forming based on the exposure pattern data is achieved at high throughput and at low costs.

2 Claims, 12 Drawing Sheets

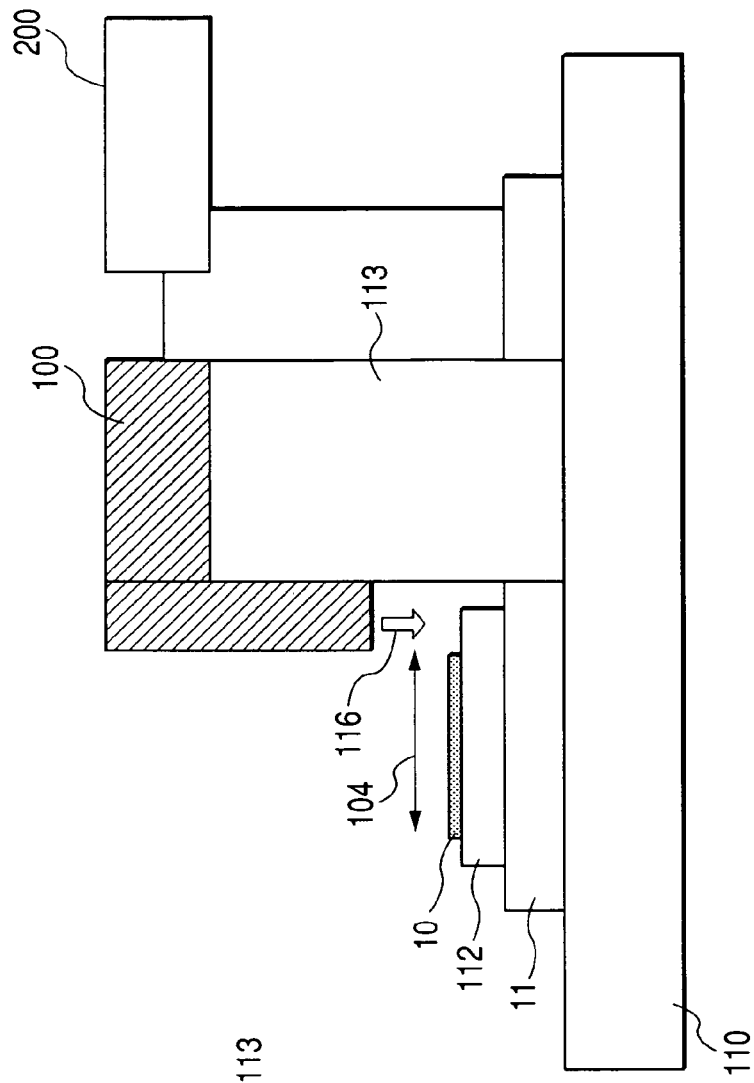

EXPOSURE APPARATUS AND EXPOSURE METHOD, AND METHOD OF MANUFACTURING ELECTRICAL WIRING BOARD

BACKGROUND OF THE INVENTION

The present invention relates to an exposure apparatus and exposure method for irradiating the surface of a photosensitive material with light in accordance with an exposure pattern and forming a desired pattern shape on the material. The invention is also directed to a method for manufacturing of a wiring board that uses the exposure method.

With the proliferation of multi-item and variable-lot-sized production in the manufacture of wiring boards, there is an expectation that it will be possible not only to shorten order-to-delivery cycle time for such production, but also to supply highly accurate wiring at lower prices. Under these circumstances, there is a strong demand for an innovative manufacturing technology that enables multi-item and variable-lot-sized production, high accuracy, and cost reduction to be realized simultaneously.

Forming a pattern on a printed-wiring board or the like by using a conventional technique has been accomplished by coating a photosensitive liquid resist or dry film resist on the board, and exposing via a photomask after the coating, then developing, etching, plating, and other processes.

Instead of the above conventional technique, a maskless direct exposure technique using an ultraviolet light or a visible light emitted from an argon ion laser or any other gas laser as a light source was later introduced in the 1990s. In this maskless direct exposure technique, making photomasks is not required. Thus, this exposure technique makes it possible not only to save mask-manufacturing equipment costs and material costs significantly, but also to reduce the time (lead time) for mask-making to manufacture boards. Since the maskless direct exposure technique also features highly accurate position alignment, it is considered as a technique that improves manufacturing processes such as printed-wiring board or semiconductor package.

It is proposed to use a semiconductor laser diode as a light source for the maskless direct exposure technique, instead of a gas laser. Gas lasers have difficulties with maintenance, including the need to supply a process gas.

Japanese Laid-Open Patent Publication No. 2004-85728 (Patent Reference 1) describes a maskless direct exposure method which employs a semiconductor laser light source to directly expose a photosensitive resin that contains an infrared absorption dye using a laser beam with a wavelength between 750 nm and 1200 nm.

In addition, Japanese Laid-Open Patent Publication No. 2004-39871 (Patent Reference 2) describes an exposure apparatus that uses a semiconductor laser as its exposure light source to emit blue-violet light whose wavelength is in the vicinity of 408 nm.

As a proposal to improve those exposure light sources, a method using a two-dimensional optical modulator to increase an imaging speed is known. The method is described in Japanese Laid-Open Patent Publication No. 2003-15077 (Patent Reference 3) and the like, in lieu of the laser beam scanning optical system including a polygonal mirror and f-θ lens optics. The two-dimensional optical modulator is a device that uses pixel-by-pixel digital on/off control to realize two-dimensional imaging. Typical examples of the two-dimensional optical modulator are a liquid-crystal panel and a digital micromirror device (DMD). Patent Reference 3 mentioned above also describes a maskless direct exposure apparatus including an ultraviolet (UV) light source, a slit, a DMD, imaging optics, and other elements. In addition, Patent Reference 3 discusses the driving principles of the DMD and the deterioration of the DMD in life due to UV light irradiation.

With respect to two-dimensional imaging that is a feature of such two-dimensional optical modulation, increasing the intensity of light allows the imaging speed to be further increased. Optics that increases light intensity is proposed in Japanese Laid-Open Patent Publications No. 2002-182157 (Patent Reference 4) and 2004-157219 (Patent Reference 5).

SUMMARY OF THE INVENTION

Through survey of the foregoing conventional techniques, by considering the recent requirement for lower cost and faster production, there is still room for improvement in balancing between the characteristics of the light source and optics used for exposure, and the characteristics of photosensitive materials (e.g., resist) used in general.

It is known that maskless exposure technology uses several kinds of two-dimensional optical modulators. The internal mechanisms of these modulators are of a particularly fine structure, and the durability and lifetimes of the modulators depend on the wavelength of incident light, as well as on the intensity thereof. In such light intensity regions as applied to the maskless exposure technology, therefore, there is the tendency that as the incident wavelength is shorter, the malfunction and/or operational defect rates of any optical modulator significantly increase, or the usable life up to the occurrence of a fatal failure becomes shorter. Particularly, in ultraviolet regions (less than 400 nm), reduction in wavelength correspondingly increases the malfunction rate during high-speed modulation, or reduces life due to the effects of light-quantum energy (detailed later herein) depending on the device structures. To make ultraviolet light incident on the two-dimensional optical modulator, therefore, there is a need to limit the intensity of the light in exchange for the increase of exposure time. Alternatively, visible light (400-800 nm) or infrared light (longer than 800 nm), both greater than ultraviolet light in wavelength, is made to enter the modulator.

In general, the photosensitive materials used in exposure technology to form electrical wiring are set up to have such a composition that enhances sensitivity in accordance with a decrease in the wavelength of the light irradiated. In terms of mass productivity and working efficiency, these materials are composed to obtain higher sensitivity stably in the neighborhood of the 365-nm i-line that is a mercury emission line, and to reduce sensitivity in visible light regions. For example, FIG. 1 is a diagram showing an example of the light absorbance of a dry film resist (i-line resist) that is a photosensitive resin typically used in the manufacture of wiring boards. FIG. 2 is a characteristic curve of spectral sensitivity characteristics of a resist. According to FIG. 1, the absorption of the ultraviolet light in a wavelength region of 365±15 nm is relatively large, and absorption dose not significantly change in this region. On the other hand, FIG. 1 indicates that the absorbance of the resist with respect to light at a wavelength of 408 nm, which is in visible light region, is about ⅕ of the absorbance with respect to light with a wavelength of 365 nm (i-line). It can therefore be seen that a large portion of irradiated light at a wavelength of 408 nm is transmitted without being absorbed. FIG. 2 indicates that although relatively large sensitivity almost free from wavelength dependence is obtained in a wavelength range around 365±15 nm, sensitivity in the neighborhood of the 408 nm wavelength which is in visible light regions is low, and the sensitivity drastically changes with wavelength.

The behavior of light with a short wavelength when the light irradiates an optical modulator or a photosensitive material is accounted for from the viewpoint of the quantum energy of the light. Since the energy of a photon is inversely proportional to wavelength (E=hc/$\lambda$: "h" is Planck's constant, and "c" is light velocity), decrease in wavelength not only increases the photon energy itself, but also the energy increase rate thereof. Thus, incident photon with a short wavelength (high energy) gives rise to more malfunctions in the light modulation optics, while it enhances reactivity of photosensitive materials. In addition, since decrease in wavelength abruptly increases the energy increase rate, dE/d$\lambda$ (photon energy variation dE versus wavelength variation d$\lambda$), there is a tendency that the malfunction rate of the modulation optics in ultraviolet light region abruptly increases.

That is, there has been the problem that, visible light longer than ultraviolet light in wavelength is preferable to functioning of the light modulation optics, and ultraviolet light shorter than visible light in wavelength is preferable to reactivity of the photosensitive materials. Thus, it has been difficult to simultaneously achieve both the high throughput of exposure and the high fineness thereof.

In addition, infrared light is long in wavelength and the energy of photons is therefore small. Thus, in Patent Reference 1, where an infrared laser is used as an exposure light source, a long irradiation time or a high-output laser light source must be required in order to obtain desired photoreactivity. Hence, it is not easy for the technique in Patent Reference 1 to suit the purpose of implementing cost reduction and short-time exposure.

In contrast to this, since the photon energy of blue-violet light at a wavelength in the vicinity of 408 nm is greater than the photon energy of infrared light, the technique (in Patent Reference 2) that uses a semiconductor laser as an exposure light source is expected to improve throughput greater than that of the technique in Patent Reference 1. As discussed above, however, the sensitivity of photosensitive materials for the formation of wiring is relatively low in this wavelength region, and there is a tendency that, in this wavelength region, the sensitivity significantly varies with wavelength and therefore processes do not easily stabilize. The wavelength of exit light from semiconductor lasers fluctuates in a range of about 408±5 nm under the influence of such factors as the nonuniformity in quality during the manufacturing processes for the semiconductor laser device, the operating environment (ambient temperature) of the device, and the electric power input thereto.

A DMD (digital micromirror device) used with the technique in Patent Reference 3 is, as discussed above, necessarily less than sufficient in ultraviolet durability. Accordingly, to use an ultraviolet light source of a wavelength region in which the sensitivity of photosensitive materials increases, low-luminance light must be used. It is unavoidable that low-luminance light exposure becomes a time-consuming process. In the visible light range where the durability of the DMD can be obtained, although a high-luminance light source can be used, exposure consumes a great deal of time since the sensitivity of photosensitive materials is low.

Patent References 4 and 5 propose a technique that uses a high-luminance light source. For a light source with enhanced luminance, however, the phenomenon called "reciprocity law failure" occurs, which usually results in failure to obtain an expected effect of the shortening of the exposure time. More specifically, even if the luminance is doubled, the necessary exposure time will not be reduced to the half; the exposure time will be typically shortened only to about 20 to 30 percent of its expected value.

Therefore, a further improvement technique, an alternative of increasing the luminance of a light source, is required from the viewpoint of practical advantages, in consideration of disadvantages (significant increase in power consumption, heat generation from an apparatus, and deterioration of the performance of an apparatus due to heat generation) associated with such increase.

For these reasons, an exposure apparatus that is enhanced in throughput and fineness and reduced in cost is not achieved using any of the conventional techniques described above.

Hence, an object of the present invention is to provide: an exposure apparatus and an exposure method, both adapted to achieve high-throughput, low-cost, and highly accurate/precise exposure that satisfies the recent requirement of lower cost and faster production; and a scheme that uses the same to manufacture a pattern and a wiring board.

In order to achieve the above object, the present invention provides a maskless exposure apparatus including: a first irradiation light source; a light modulation optics that modulates irradiation light emitted from the first irradiation light source so as to form a beam of light in a desired shape in the basis of desired exposure pattern data; an imaging optics that generates an image by converging the beam of light, formed into the desired shape by the light modulation optics, on the surface of an object to be exposed to the light; a scanning means that scans in a relative fashion the beam of light of the desired shape, converged by the imaging optics to generate the image, and the surface of the object exposed to the light; and a second irradiation light source which irradiates with an energy ray, a desired area on the surface of the object exposed, inclusive of a region in which the beam of light of the desired shape has been converged to generate the image.

The present invention also provides a maskless exposure apparatus including: a first irradiation light source; a two-dimensional digital optical modulator that digitally modulates the irradiation light emitted from the first irradiation light source, so as to form a beam of light of a desired shape on the basis of desired exposure pattern data; an imaging optics that generates an image by converging the beam of light, formed into the desired shape by the two-dimensional digital optical modulator, on the surface of an object to be exposed to the light; a scanning means that scans in a relative fashion the beam of light of the desired shape, converged by the imaging optics to generate the image, and the surface of the object exposed to the light; and a second irradiation light source for irradiating with an energy ray, a desired area on the surface of the object exposed, inclusive of a region in which the beam of light of the desired shape has been converged to generate the image.

In addition, the present invention provides a maskless exposure apparatus including: a beam light source as a first irradiation light source; a light modulation optics that modulates the irradiation light emitted from the first irradiation light source, so as to form a beam of light of a desired shape on the basis of desired exposure pattern data; an imaging optics that generates an image by converging the beam of light, formed into the desired shape by the light modulation optics, on the surface of an object to be exposed to the light; a scanning means that scans in a relative fashion the beam of light of the desired shape, converged by the imaging optics to generate the image, and the surface of the object exposed to the light; and a second irradiation light source that irradiates with an energy ray, a desired area of space on the surface of the object exposed, inclusive of a region in which the beam of light of the desired shape has been converged to generate the image.

The present invention further provides a maskless exposure apparatus including: a first irradiation light source that emits light inclusive of ultraviolet rays; a two-dimensional digital optical modulator that digitally modulates the irradiation light emitted from the first irradiation light source, so as to form a beam of light of a desired shape on the basis of desired exposure pattern data; imaging optics that generates an image by converging the beam of light, formed into the desired shape by the two-dimensional digital optical modulator, on the surface of an object to be exposed to the light; a scanning means that scans in a relative fashion the beam of light of the desired shape, converged by the imaging optics to generate the image, and the surface of the object exposed to the light; and a second irradiation light source for irradiating with an energy ray, a desired area of space on the surface of the object exposed, inclusive of a region in which the beam of light of the desired shape has been converged to generate the image.

Furthermore, the present invention provides a maskless exposure apparatus including: a first irradiation light source that emits light inclusive of ultraviolet rays; a photomask holder that holds a photomask having a light-shielding pattern drawn thereon in accordance with desired exposure pattern data; an imaging optics that generates an image by converging, after a beam of light of a desired shape has passed through the photomask, the beam of light on the surface of an object to be exposed to the light; and a second irradiation light source for irradiating with an energy ray, a desired area of space on the surface of the object exposed, inclusive of a region in which the beam of light of the desired shape has been converged to generate the image.

A further aspect that the present invention provides is an exposure apparatus in which a center line of an optical axis of the light emitted from the second irradiation light source is disposed in any of regions from an edge of the imaging convergence region of the light emitted from the first irradiation light source, to an edge of the object exposed.

A further aspect that the present invention provides is an exposure apparatus in which a center line of an optical axis of the light emitted from the second irradiation light source is disposed in parallel with an imaging convergence central axis of the light emitted from the first irradiation light source.

A further aspect of the present invention exists in that the invention provides an exposure apparatus in which a center line of an optical axis of the light emitted from the second irradiation light source is disposed so as to cross, on the surface of the object exposed, an imaging convergence central axis of the light emitted from the first irradiation light source.

Besides, the present invention provides an exposure method for processing a photosensitive material on the surface of an object to be exposed to light, into a desired shape by first irradiating the surface of the object with a beam of light that has been processed into a desired pattern shape, and then developing the photosensitive material; wherein, independently of the first exposure step of conducting irradiation with the beam of light that has been processed into the desired pattern shape, a second exposure step is provided to irradiate with a uniform energy ray within a desired area of space inclusive of a region irradiated during the first exposure.

Moreover, the present invention provides an exposure method for processing a photosensitive material on the surface of an object to be exposed to light, into a desired shape by first irradiating the surface of the object with a beam of light that has been processed into a desired pattern shape, and then developing the photosensitive material; wherein are simultaneously executed a first exposure irradiation step of conducting irradiation with the beam of light that has been processed into the desired pattern shape, and a second exposure irradiation step of irradiating with a uniform energy ray within a desired area of space inclusive of a region irradiated during the first exposure.

A further aspect that the present invention provides is an exposure apparatus including: first exposure irradiation light source optics that conducts irradiation with a beam of light that has been processed into a desired pattern shape; and second exposure irradiation light source optics that irradiates with a uniform energy ray the inside of a desired area of space inclusive of a region irradiated by the first exposure optics; wherein the first exposure irradiation light source optics and the second exposure irradiation light source optics may be interactively controlled.

A further aspect that the present invention provides is an exposure apparatus including: a first irradiation light source; a light modulation optics that uses desired exposure pattern data to form a beam of light of a desired shape by modulating the irradiation light emitted from the first irradiation light source; an imaging optics that generates an image by converging the beam of light, formed into the desired shape by the light modulation optics, on the surface of an object to be exposed to the light; a scanning means that scans in a relative fashion the beam of light of the desired shape, converged by the imaging optics to generate the image, and the surface of the object exposed to the light; a second irradiation light source; and a spectroscopic optics that splits light emitted from the second irradiation light source into beams each of a different wavelength; wherein the spectroscopic optics for splitting the emitted light from the second irradiation light source into the beams each of a different wavelength may be disposed such that the beams that have been obtained by splitting the emitted light during passage thereof through the spectroscopic optics exit the first irradiation light source, then pass through the modulation optics and the imaging optics, and share a region in which the beam of light of the desired shape has been converged to generate the image.

Moreover, the present invention provides a technique on which is based an exposure apparatus including: a first irradiation light source; a light modulation optics that uses desired exposure pattern data to form a beam of light of a desired shape by modulating the irradiation light emitted from the first irradiation light source; an imaging optics that generates an image by converging the beam of light, formed into the desired shape by the light modulation optics, on the surface of an object to be exposed to the light; a scanning means that scans in a relative fashion the beam of light of the desired shape, converged by the imaging optics to generate the image, and the surface of the object exposed to the light; and a second irradiation light source with a wavelength selector.

Moreover, the present invention provides a method of manufacturing a wiring board, adapted to coat a photosensitive material on the board, conduct the photosensitive material to a photochemical reaction, develop the said photosensitive material so as to form a resist pattern of a desired shape on the photosensitive material, and process a conductor using the resist pattern; wherein the process step of inducing a photochemical reaction of the photosensitive material is split into: a first exposure irradiation stage for inducing the photochemical reaction only in a desired section by irradiating the desired section with a beam of light that has been processed into a desired shape; and a stage for inducing another photochemical reaction in a region inclusive of a neighboring section of a region which is irradiated during the first exposure irradiation stage by conducting irradiation with a uniform energy ray such that the energy ray will include at least the region irradiated during the first exposure irradiation stage.

As described above, the present invention makes possible the high-throughput, low-cost, and highly accurate/precise exposure that satisfies the recent requirement levels of cost reduction and delivery time reduction.

BRIEF DESCRIPTION OF THE DRAWINGS

FIGS. 13A and 13B area schematic front view and a schematic side view respectively of a further embodiment of the exposure apparatus of the present invention.

DETAILED DESCRIPTION OF THE PREFERRED EMBODIMENTS

Embodiments of an exposure apparatus, an exposure method, and a wiring board manufacturing method each according to the present invention, will be described hereunder using the accompanying drawings.

Figure 1:
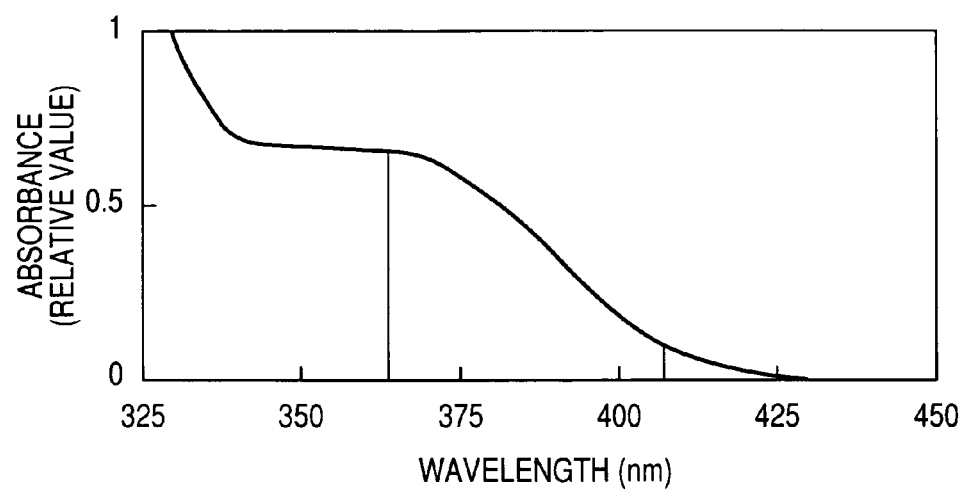
FIG. 1 is a diagram that shows light-absorbing characteristics of a general-purpose photosensitive resin exposed using an exposure apparatus of the present invention.
Figure 2:
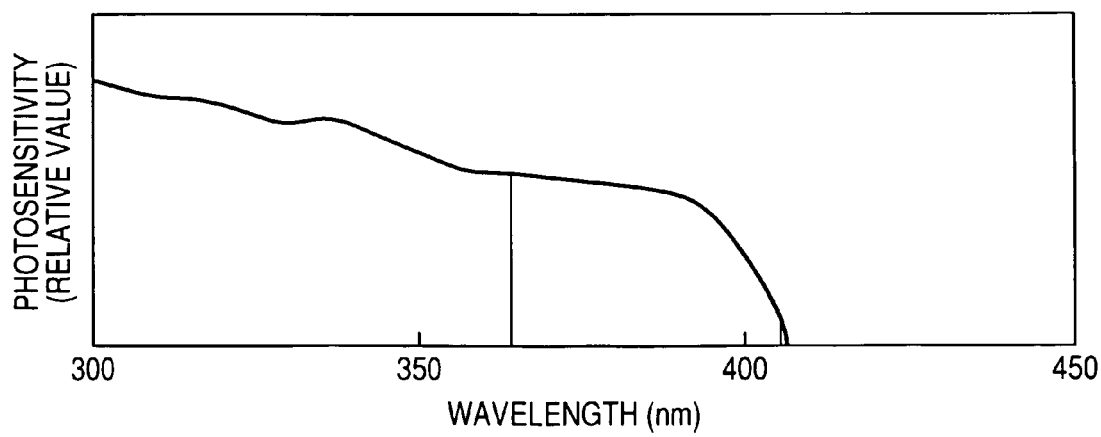
FIG. 2 is a diagram that shows spectral sensitivity characteristics of the general-purpose photosensitive resin exposed using the exposure apparatus of the present invention.

First, the photosensitive material (i-line photosensitive material) used in the present invention is a photosensitive material used to manufacture wiring boards. The i-line photosensitive material is subjected to lithographic processing while being irradiated with the light ranging from ultraviolet light to near-ultraviolet light, mainly at a wavelength between 350 and 450 nm, during the process steps of manufacturing a wiring board. The photosensitive material preferred in the present invention may be either a dry film form that has been preprocessed into a film form, or a liquid form. Irrespective of whether the photosensitive material is of the film form or the liquid form, before a desired object (e.g., a wiring board) is exposed to light, the material is properly coated on the surface thereof using a required method. After being coated, the photosensitive material preferred in the present invention will have a film thickness approximately ranging from 2 to 100 micrometers, and a minimum processing dimension (line width) will be about 1 micrometer. The photosensitive material taken here as preferred is based primarily on photosensitive polyimide, photosensitive benzocyclobutene (BCB), a photosensitive acrylate, a photosensitive epoxy acrylate, photosensitive polybenzoxazole, a photosensitive cardo acrylate resin, and/or the like. The material actually applied is selected after determination of processing conditions appropriate for a particular chemical composition of the material. It is unnecessary to newly indicate herein that depending on a structure and purpose of use of the object to be exposed, a photosensitive material of a composition other than those mentioned above by way of example can also be used. Photosensitive materials for use in wiring board manufacturing processes are known to have various applications. More specifically, these materials are each used as an etching resist, a plating resist, a solder resist, a wiring cover-layer, or the like. Optimizing the processing conditions according to the particular application/purpose of use makes 2 to 1000-micrometer processing achievable by applying the present invention. Photosensitive materials are classified into a positive type and a negative type according to particular differences in reactivity to light, and a technique according to the present invention is applicable to both light-reactive types of photosensitive materials. In the present invention, the positive type is usually preferable in terms of fineness, and the negative type, in terms of process margins. The technique of the present invention typically yields the greatest effect practically achievable, if applied to the positive type to form a high-resolution image (minimum processing dimension=approx. 1 micrometer) or used with the negative type to obtain a general-purpose application (processing dimension=10 to 1,000 micrometers). FIGS. 1 and 2 show examples of light-absorbing characteristics and spectral sensitivity, respectively, of a general-purpose, negative, photosensitive resin according to the present invention.

Figure 3:
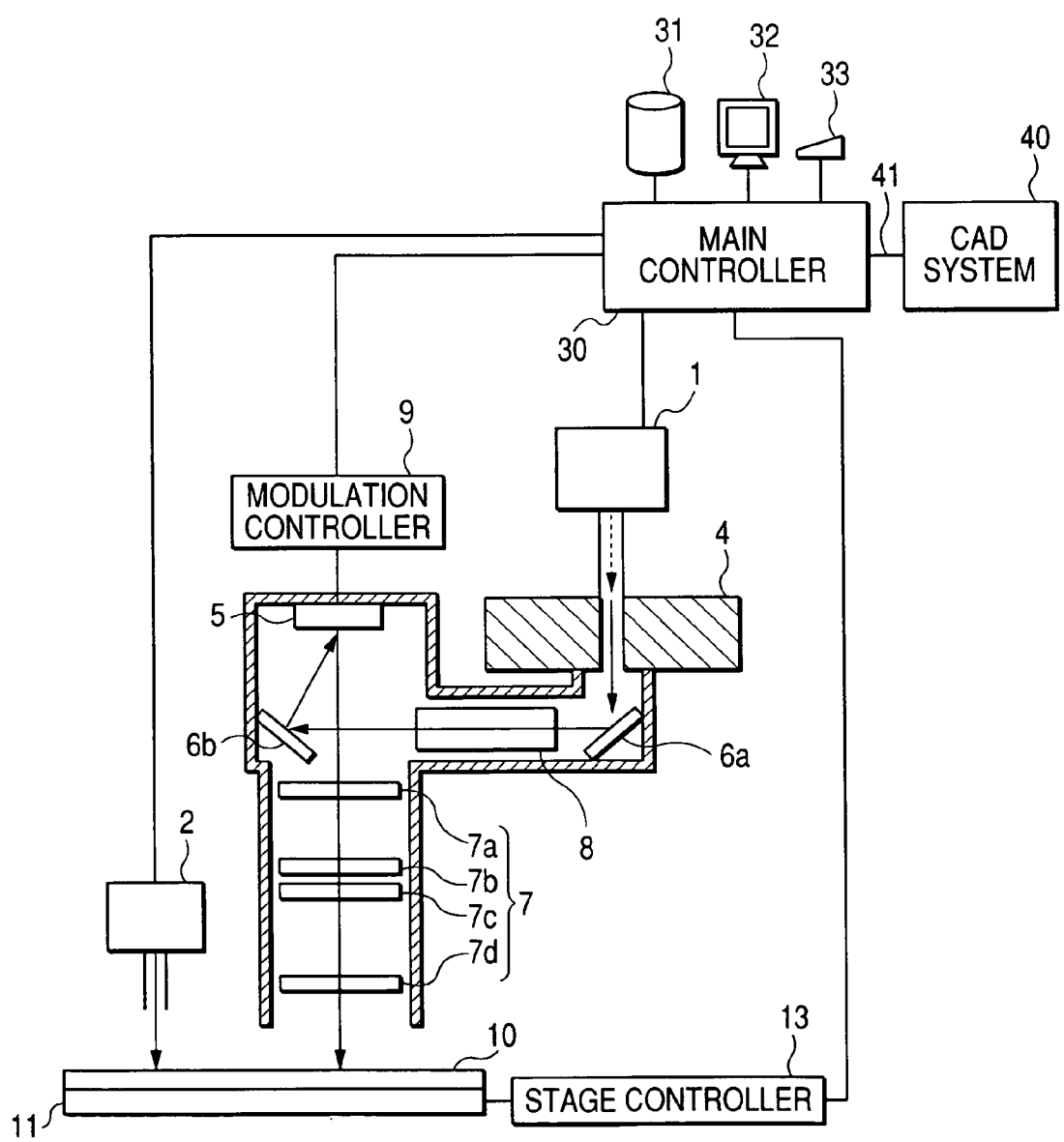
FIG. 3 is a schematic diagram showing the best mode of embodiment of the exposure apparatus of the present invention.

In order to achieve a further shortened exposure time while utilizing the features of materials cost reduction, lead time reduction, and highly accurate position alignment in the maskless exposure technique, an exposure apparatus according to the present invention includes such a dual light-source system as shown in FIG. 3. That is, as shown in FIG. 3, a first embodiment includes: a first irradiation light source 1; an optical element 4 for removing only harmful beam components of the irradiation light emitted from the first irradiation light source 1; beam-shaping optics 8 for shaping an intensity distribution of the irradiation light and a shape thereof; light modulation optics 5 for modulating the shaped irradiation light on the basis of exposure pattern data and thus forming a beam of light; imaging optics 7 for generating an image by converging the obtained beam of light on the surface of an object 10 to be exposed to the light; a second irradiation light source 2 for irradiating the object 10 with an energy ray independently of the first irradiation light source 1; and a scanner including a stage 11 on which to mount the object 10 and a stage controller 13 to control the stage 11.

In the present invention, during the irradiation of the object 10, selective pattern-imaging irradiation from the first irradiation light source, and nonselective large-area energy irradiation from the second irradiation light source 2 are combined to integrate both amounts of light. This suppresses the occurrence of a reciprocity law failure during the selective pattern-imaging irradiation from the first irradiation light source, thus realizing the exposure time reduction and exposure throughput enhancement that have been unachievable using the conventional techniques.

Components of the exposure apparatus according to the present invention will be described in detail hereunder. Operation of the exposure apparatus will also be described together.

A near-ultraviolet light source that emits near-ultraviolet light at a wavelength of about 405 nm is used as the first irradiation light source 1, since near-ultraviolet light has a maximum photon energy level in a visible light region which permits incidence of high-intensity light. In the best mode of embodiment of the present invention, the first irradiation light source 1 is constituted by a large number of near-ultraviolet light sources arranged adjacently to one another. Within a permissible ultraviolet durability range of the light modulation optics 5, however, a light source that emits the light including ultraviolet rays of low intensity can be used as an alternative. The ultraviolet durability of the light modulation optics 5 has dependence on a structure of an internal microstructured mechanism of the light modulation optics and thus depends on the kind thereof. According to studies of the present inventor, it is preferable that ultraviolet light intensity in a wavelength range of 300 to 400 nm be smaller than a peak value of 10 W/cm$^2$ on the surface of the modulation optics. If the ultraviolet light intensity on the surface of the modulation optics exceeds the peak value of 10 W/cm$^2$, energy of any beam components that may have not been reflected by a modulation mirror will distort the internal microstructured mechanism of the modulation optics, resulting in greater possibilities of the mechanism easily malfunctioning or of thermal stresses being internally accumulated to damage or destroy the mechanism. Such far-ultraviolet light, electron beams, X-rays, and other radiation as less than 300 nm in wavelength will be more likely to significantly increase an occurrence rate of malfunctioning of the modulation optics 5 or shorten a life thereof. The light source used, therefore, is free of the above spectrum composition of radiation. In FIG. 3 is shown an example of a structure including the optical element 4 for removing far-ultraviolet light, electron beams, X-rays, and other harmful beam components from the light emitted from the first irradiation light source 1. In the present invention, while the optical element 4 can be used to remove harmful beam components, more specific examples usable instead of the element 4 include an optical filter and others. The wavelength and other factors of the light source actually used may permit the optical element 4 to be omitted. In a visible light range exceeding 400 nm, continuous use of the light source 1 at 10 W/cm$^2$ is possible, and at up to an instantaneous peak intensity level of about 20 W/cm$^2$, use of the light source is possible since distortion does not lead to the accumulation of thermal stresses. More specific examples of a low-intensity ultraviolet light source usable in the present invention include a metal halide lamp, a low-pressure mercury lamp, a semiconductor laser, and the like. A light source other than those mentioned above by way of example is usable, only if it is a low-intensity ultraviolet light source. The first irradiation light source 1 can be a discharge lamp such as an ultrahigh-pressure mercury lamp, xenon lamp, or halogen lamp, or a laser light source such as a YAG third-order higher-harmonic laser. However, the ultraviolet light intensity of the light emitted from any of these light sources must have been adjusted using a filter, a grating, a beam shaper, a beam diffuser, or the like.

The irradiation light, after being emitted from the first irradiation light source 1, enters the light modulation optics 5 via a first light-guiding optical element 6a, the beam-shaping optics 8 for shaping the light intensity distribution of the beam and the shape of the beam, and a second light-guiding optical element 6b. The light modulation optics 5 is digitally controlled by a modulation controller 9, which controls the light modulation optics 5 as a subsystem of a main controller 30 provided to control the entire exposure apparatus. After being designed using a computer-aided design (CAD) system 40, desired exposure pattern data is transmitted to the main controller 30 via a network 41 and then stored into a storage device 31 having various control programs and arithmetic programs stored therein.

The network 41 may be part of, or a communications network relayed via, a public communications line or may be such that the CAD system 40 and the exposure apparatus according to the present invention are installed apart from each other. Providing a manufacturing site in a place where a product to be manufactured using the exposure apparatus will be used, that is, near the so-called place of consumption, and installing the exposure apparatus at the manufacturing site will make it possible to minimize the time required for product deliver between the manufacturing site and the place of consumption. Minimizing the product delivering time required will contribute to minimizing a stock of workpieces in process and a distribution stock, reducing sales opportunities loss, and realizing on-demand immediate production, in addition to reducing product delivering costs. In such a business model, pattern data needs to be transmitted from the CAD system 40 installed at a design site for the pattern data, to the exposure apparatus installed at the manufacturing site. In addition, the data usually contains a great deal of information to be kept secret, such as manufacturing-related know-how and sales information. For these reasons, the data is encrypted using a specific procedure beforehand to prevent the data from being wiretapped and falsified during communication. In order to reduce any possibilities of wiretapping and falsification by shortening the time for which the pattern data will be passed through the communications network, the data is desirably compressed to reduce data capacity prior to encryption. More desirably, the exposure apparatus further includes an information processor to undertake automatic processing during process steps from data compression to encryption and from decryption to data decompression. With the information processor, the exposure apparatus can eliminate the likelihood of any mistakes in input due to human errors.

The main controller 30 is connected to at least a data display unit 32 and an input device 33 as well as to the storage device 31, and has an arithmetic processor (not shown) for executing the control programs and arithmetic programs stored within the storage device 31. In order to control the modulation controller 9 and the stage controller 13, the main controller 30 also includes a communications element to communicate with these subsystem components. Needless to say, the exposure apparatus may have a plurality of modulation controllers 9 and stage controllers 13 connected to one main controller 30. The connection of a plurality of controllers brings forth a possibility of expanded production volumes with suppressed plant and equipment investments.

Light that has entered the light modulation optics 5 is modulated by the above system (main controller 30 and the modulation controller 9), whereby the light is formed into a beam of a desired shape. The exposure apparatus of the present invention further includes, although not shown in FIG. 3, a measuring element for measuring a position, geometry, and shape of either the object 10 to be exposed, or a specific shape formed on the surface of the object 10. Measurement results that the measuring element has acquired are compared with required data which are transmitted from the CAD system and stored within the storage device 31, and used to calculate correction data for fine adjustment of operation of both the light modulation optics 5 and the stage 11.

Figure 12:
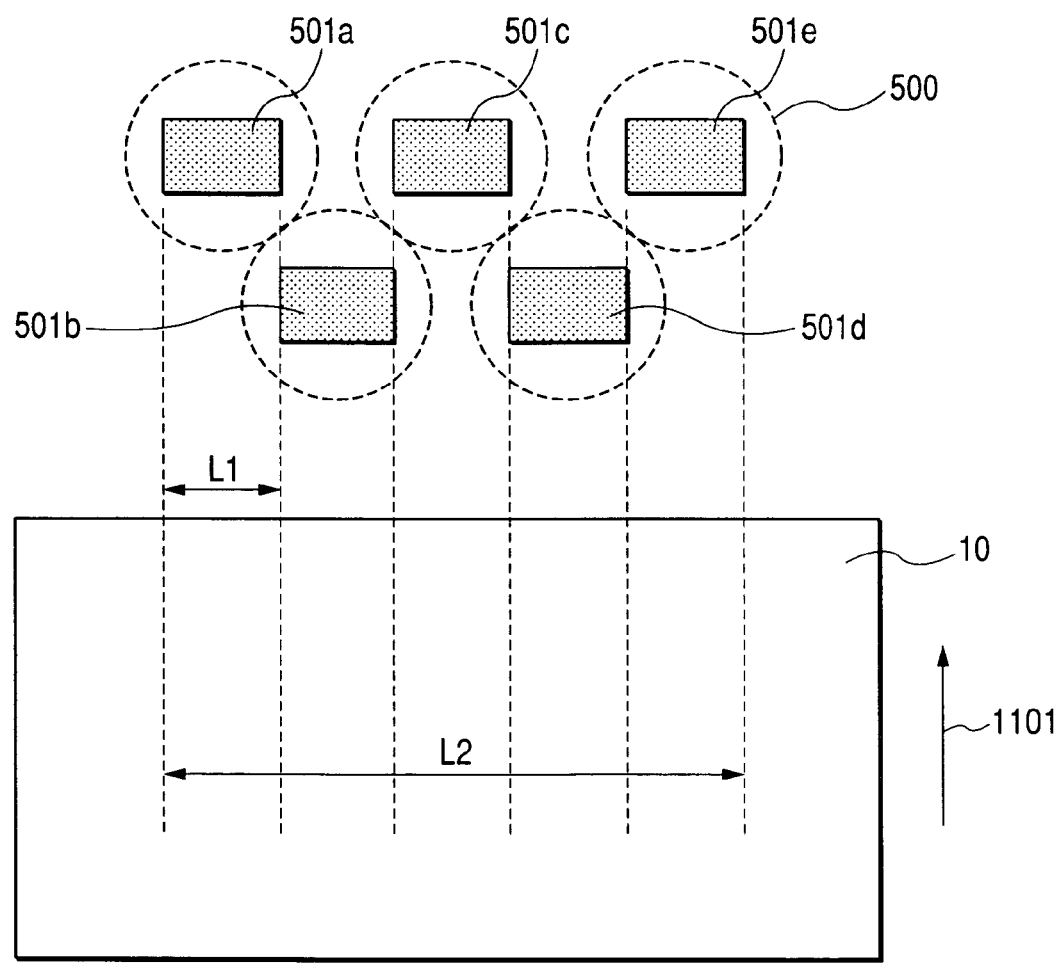
FIG. 12 is a schematic diagram showing an example of disposing a modulator of an exposure apparatus of the present invention.

The best embodiment preferred as the light modulation optics 5 in the present invention is a one-dimensional or two-dimensional reflecting mirror array. More specifically, examples of the mirror array include a digital micromirror device (DMD), a grating light valve (GLV), a spatial light modulator (SLM), and the like. Any other spatial light modulator may be used alternatively. The present invention attains high-speed optical modulation by using any one of these optical modulators capable of operating at high speed. Since large-area simultaneous spatial modulation can be achieved by combining a plurality of spatial modulators, multiple spatial modulators are arranged next to one another as required. FIG. 12 shows a structural example of the light modulation optics 5 having five spatial modulators arranged next to one another in a staggered fashion. In this staggered arrangement, a region width L2 five times as great as a region width L1 of a region 501a in which a beam that has been modulated by one spatial modulator is converged to form an image can be totally irradiated at a time. A relative arrangement of the spatial modulators is preferably determined for a minimum distance between beam-imaging regions, and this can be accomplished by considering factors such as a relationship between a geometrical shape of a housing outline 500 of a specific spatial modulator, a geometrical shape of the beam-imaging region 501a, and a scanning direction 1101 of the stage. The staggered arrangement of the spatial modulators, shown in FIG. 12 by way of example, allows for the facts that the housing outline 500 of one spatial modulator has an approximately circular geometrical shape and that the beam-imaging region 501a has an approximately rectangular geometrical shape, with at least one side thereof being approximately parallel to the scanning direction 1101 of the stage. Alternatively, the beam-imaging region 501a may have an approximately rectangular geometrical shape, with at least one side thereof being angled to the scanning direction 1101 of the stage. A more specific example of a scanning angle is such that the scanning angle can be obtained in a direction which becomes an arc tangent of a ratio of a short side versus long side of an approximately rectangular geometrical shape of the beam-imaging region 501a.

The beam that has been modulated by the light modulation optics 5 is passed through the imaging optics 7 and then converged on the surface of the object 10 in order to form an image (about 1 micrometer in minimum dimension). The imaging optics 7 is an assembled unit including various optical components, and a configuration including a first imaging lens 7a, a microlens array 7b, a diffraction grating 7c, and a second imaging lens 7d, is shown in FIG. 3 as an example of an optical components assembly suitable in the present invention. This example, however, may be replaced by any other optical components configuration capable of realizing the minimum resolution (about 1 micrometer) required for the imaging optics 7. Although this is not shown in FIG. 3, the exposure apparatus desirably has an independent light-absorbing structure for absorbing any stray light components occurring during an operational 'off' status of microstructured mirrors of the modulation optics 5. In addition, the apparatus desirably includes a heatsink for accelerated heat release from the light-absorbing structure. The heatsink makes it possible to prevent heat accumulation in and on the light-guiding optics 6, the imaging optics 7, and other sections, and maintain highly accurate pattern forming, even after extended nonstop operation.

Exposure of the object 10 is conducted with the object mounted on the planar stage 11. The planar stage 11 is designed so as to be moved (scanned) X-Y biaxially by the stage controller 13, and moving length, moving speeds, and moving directions of the stage 11 are controlled by the main controller 30 so that the stage synchronizes with modulating operation of the light modulation optics 5. The modulating operation of the modulation optics 5 and stage scanning by the stage controller 13 cause the beam modulated by the light modulation optics 5 to scan along the surface of the object 10 in a relative fashion, and a desired pattern is consequently drawn on the entire surface of the object 10. This pattern-drawing operation is so-called point drawing, in which a number of beam spots are arranged in progressively offset form to draw the pattern as a whole. During this drawing process, correction data that has been calculated from the measured position and geometry of the object 10 or of a specific shape formed on the surface thereof is used to conduct corrections on the moving length, moving speeds, and moving directions of the stage 11, and on the modulating operation of the light modulation optics 5.

Pattern data to be drawn is converted into an aggregate of a large number of micropoints, each of which is then converted into a digital signal for on/off control of each microstructured mirror of the light modulation optics 5 and stored into the storage device 31. When the required pattern data is drawn, associated digital data is called up from the storage device 31, then processed by the arithmetic processor, and converted into control signals for controlling the light modulation optics 5 and the stage 11. The exposure apparatus of the present invention uses an optimized data transfer device and arithmetic device to minimize such a successive processing time. The use of these devices allows free selection of pattern data specified according to a particular production schedule, thus implementing mixed-flow production of intermix multi-kind production and on-demand immediate production. Naturally, production scheduling is desirably synchronized with a system such as ERP (Enterprise Resource Planning).

In this manner, the desired pattern is drawn on a required region of the surface of the object 10 by means of the first irradiation light source 1. As described above, the exposure apparatus according to the present invention also has an independent second irradiation light source and irradiates a region including the above pattern-drawing region, preferably, also including an even larger region, with the light emitted from the second irradiation light source 2. The second irradiation light source 2 is also controlled by the main controller 30. The second irradiation light source 2 can emit energy rays at intensity levels of 1% or more of all exit energy, but up to 100% thereof, wherein the energy rays contain the light falling under a category somewhere between ultraviolet light and near-ultraviolet light, in the wavelength range 350 to 450 nm. More specifically, a discharge lamp such as a metal halide lamp, low-pressure mercury lamp, ultrahigh-pressure mercury lamp, xenon lamp, or halogen lamp, or a laser light source such as a YAG third-order higher-harmonic laser, or a semiconductor laser can be used in a preferred fashion as the second irradiation light source 2 in the present invention. In the best embodiment, the second irradiation light source 2 is, for example, a semiconductor laser whose irradiation energy is easy to control, or a metal halide lamp that is inexpensive and whose maintenance is also easy. Depending on desired needs, one of the above light sources is selected with electric power consumption, maintenance and management, dosage controllability, and the like taken into consideration. Alternatively, multiple such light sources may be combined as required.

In the present invention, an optimal combination can be selected from the light sources proposed above as examples of the second irradiation light source 2. The selection requires considering various factors such as the photosensitive characteristics and shape of the photosensitive material which is the object to be exposed, and spectral radiation characteristics of the light source itself and the kind of the first irradiation light source. However, to omit the troublesome operations of changing the combination of light sources with each change of the product type of the object 10, it is desirable to have a mechanism capable of adjusting the radiant energy that the object 10 receives from the second irradiation light source 2. More specifically, there are provided for the object 10, for instance, either a filter folder for incorporating such an optical filter as to permit only light of a specific wavelength to go through, a grating or prism for splitting light, or an optical tube that makes a shutter, a slit, an integrator, and other optics mountable and dismountable.

Figure 4:
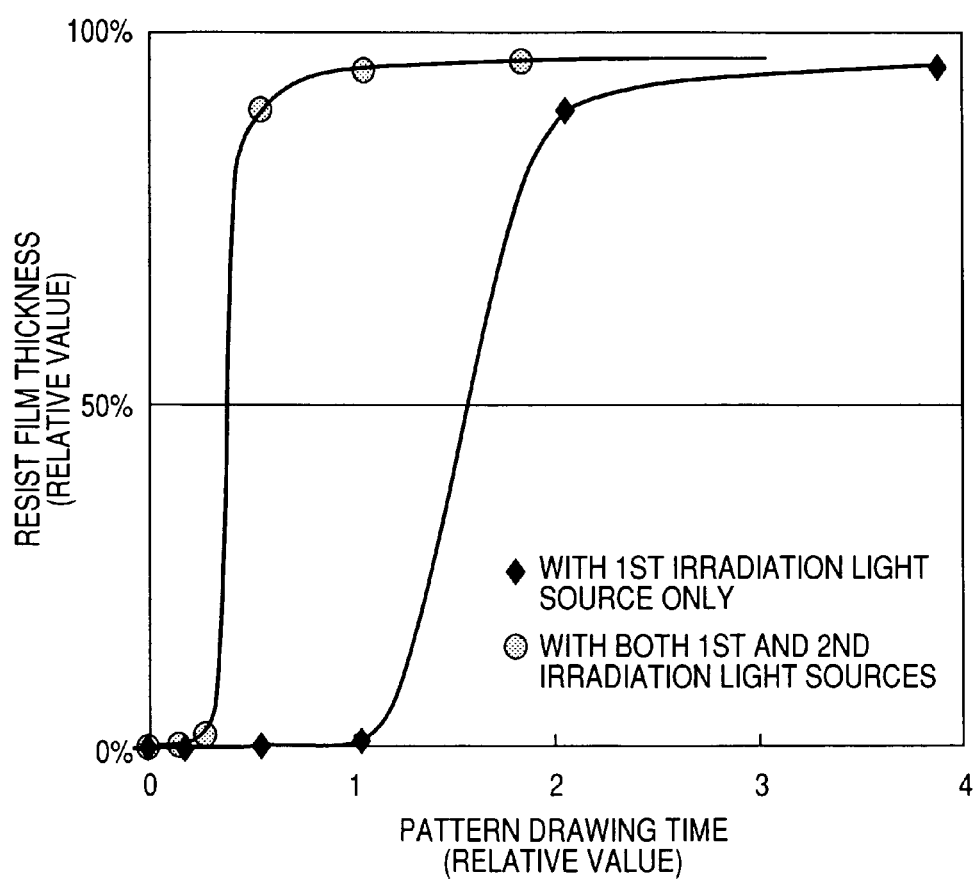
FIG. 4 is a diagram showing an example of pattern-drawing results (relationship between a pattern-drawing time and film thickness) obtained using the exposure apparatus of the present invention.

The exposure apparatus of the present invention may employ an irradiation method consisting of selective pattern-imaging irradiation from the first irradiation light source, and nonselective large-area energy irradiation from the second irradiation light source 2. This suppresses the occurrence of a reciprocity law failure during the selective pattern-imaging irradiation from the first irradiation light source, resulting in exposure time reduction and exposure throughput enhancement being realized. Details of the exposure method according to the present invention will be described later herein. FIG. 4 shows an example of the resist shape measurement experimental results that were obtained by drawing a pattern (pattern width=10 to 1,000 micrometers) on a negative-type resist by use of the exposure apparatus of the present invention and then developing the resist under required conditions. In FIG. 4, the pattern-drawing time is taken on the horizontal axis, and the resist film thickness after developing, on the vertical axis. Obtained experimental results indicate that during formation of a pattern using a combination of selective pattern-imaging irradiation from the first irradiation light source 1 and nonselective large-area energy irradiation from the second irradiation light source 2, the pattern-drawing time required is reduced to about ⅓ of that achieved during formation of a pattern only with selective pattern-imaging irradiation from the first irradiation light source. The experimental results also indicate that throughput can be consequently enhanced to three times that of the latter pattern-forming method.

Figure 5:
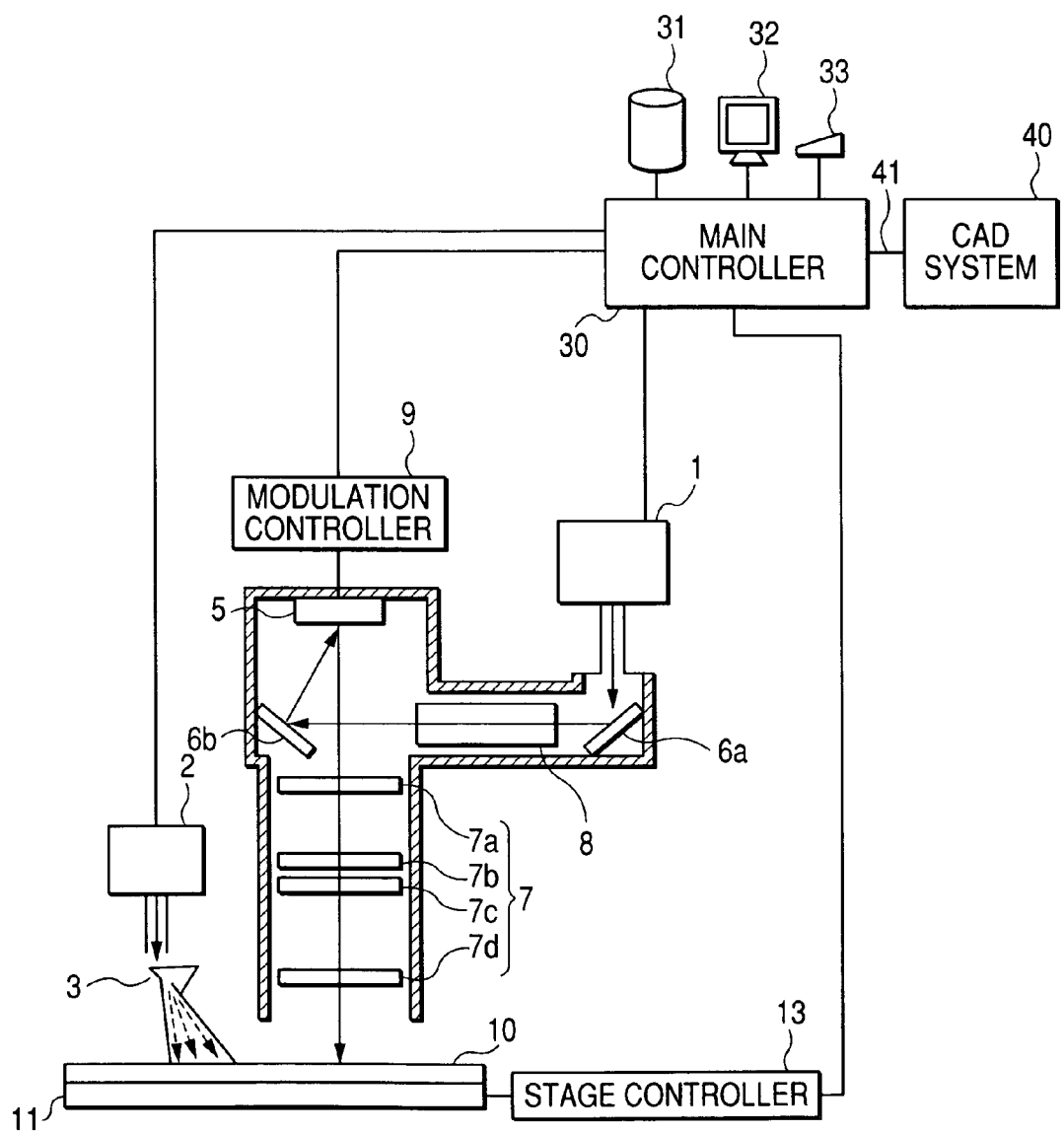
FIG. 5 is a schematic diagram showing another embodiment of the exposure apparatus of the present invention.

In the best embodiment of the present invention, the exposure apparatus components are arranged such that an integrated amount of received light from the second irradiation light source 2 is uniform at least in the region subjected to selective pattern-imaging irradiation from the first irradiation light source 1. The integrated amount of received light from the second irradiation light source 2 is the total amount of light that was integrated for each wavelength, at each point on the surface of the object 10. For example, in such an exposure apparatus configuration as shown in FIG. 5, before emitted light from second irradiation light source 2 reaches the surface of object 10, the light is split into beams by spectroscopic element 3 installed on a path which leads to the surface of the object 10. At a specific moment, the wavelength of the light received at each point varies from point to point, on the surface of the object 10. Additionally, the intensity of the light received from second irradiation light source 2 at each point on the surface of the object 10, is not necessarily the same at a particular moment. However, since the object 10 is exposed in a stage-mounted state and the stage is moved (scanned) X-Y biaxially by the stage controller 13, the integrated amount of received light from the second irradiation light source 2 at each point becomes uniform over the entire surface of the object 10. Desirably, the spectroscopic element 3 for splitting the light that has been emitted from the second irradiation light source 2 contains a mechanism for adjusting an angle formed with respect to the light emitted from the second irradiation light source 2. Adjusting the angle according to particular needs is expected to produce various advantageous effects. For example, the angle can be adjusted so as to adjust a time from completion of the selective pattern-imaging irradiation from the first irradiation light source 1 to a start of the energy ray irradiation from the second irradiation light source 2. Additionally, the angle can be set so that irradiation with short-wavelength components of the energy ray from the spectroscopic element 3 of the second irradiation light source 2 is conducted simultaneously with the selective pattern-imaging irradiation from the first irradiation light source 1 and so that irradiation with long-wavelength components of the energy ray from the spectroscopic element 3 of the second irradiation light source 2 is conducted after the selective pattern-imaging irradiation from the first irradiation light source 1.

In the most desirable embodiment of the present invention, exposure time can be shortened by concurrent executing both the selective pattern-imaging irradiation from the first irradiation light source 1 and the nonselective uniform-energy ray irradiation from the second irradiation light source 2. However, the simultaneous irradiation with the two kinds of light is not always required if the simultaneous irradiation cannot be conducted appropriately in terms of the shape and/or size of the object 10 or for other reasons. If the simultaneous irradiation is not to be conducted, in order to ensure uniformity in the integrated amount of received light from the second irradiation light source 2, the nonselective uniform-energy ray irradiation from the second irradiation light source 2 may precede the selective pattern-imaging irradiation from the first irradiation light source 1. Conversely, the nonselective uniform-energy ray irradiation from the second irradiation light source 2 may be additionally conducted after the selective pattern-imaging irradiation from the first irradiation light source 1. In these cases, the nonselective uniform-energy ray irradiation from the second irradiation light source 2 is conducted independently of the selective pattern-imaging irradiation from the first irradiation light source 1, with the result that this sequence contributes to reduction in the time required for pattern drawing. More specifically, while the selective pattern-imaging irradiation from the first irradiation light source 1 is being conducted on a first board, a second board is irradiated with the nonselective uniform-energy ray from the second irradiation light source 2. The drawing time can be shortened by conducting concurrent selective processing with the first irradiation light source 1 and the second irradiation light source 2 concurrently in such procedures.

The uniformity in the integrated amount of light can better be achieved by installing required optics such that a centerline of an optical axis of the light emitted from the second irradiation light source 2 is positioned on the surface of the object to be exposed. Also, a mechanism is desirably added that allows the optical axis centerline of the light emitted from the second irradiation light source 2 to be adjusted when necessary. Specific examples of an optical-axis centerline adjusting mechanism preferred in the present invention include an angle adjuster added to an installation section of the second irradiation light source 2, a galvanometer-mirror installed on the optical path ranging from the second irradiation light source 2 to the object 10, and other optical components. Advantageous effects preferred in the present invention tend to be obtainable in cases where the optical axis center line of the light emitted from the second irradiation light source 2 is parallel to an optical axis center line of the light emitted from the first irradiation light source 1 and where the optical axis center line of the light emitted from the second irradiation light source 2 crosses the optical axis center line of the light emitted from the first irradiation light source 1, on or near the surface of the object 10.

In terms of exposure principles of the present invention, the exposure apparatus can be constructed so that optical components such as the first irradiation light source 1 and the second irradiation light source 2, and the object 10 vacuum-sucked onto a table 112 disposed on the stage 11 are scanned in a relative fashion. The exposure apparatus may be constructed so that the table 112 and the object 10 move with the optical components fixed, or may be constructed so that the optical components move with the stage 11 fixed. Further detailed description is given below using FIGS. 13A and 13B, both showing examples of different exposure apparatus configurations. FIGS. 13A and 13B are diagrams that show examples of schematic configurations of an exposure apparatus which includes a bed 110, a column 113, an exposure head 100 installed over the column 113, and a table 111. FIG. 13A is a front view, and FIG. 13B is a side view. The stage 11 is adapted so that the table 12 and an object 10 set up thereon can be controlled to move in directions of arrows 104 and 105. Conditions for controlling the movements of the table 12 and the object 10, and conditions for exposure with the optical components such as the first irradiation light source 1 and second irradiation light source 2 whose light is output from the exposure head 100 are both controlled by a controller 200. In synchronization with the movement of the object 10 in the direction of the arrow 104, a beam of light 116 is emitted from the exposure head 100 and a desired region on the object 10 is exposed to the light. The column 113 can be moved longitudinally along the surface of the bed 110, and when the column 113 operates, the exposure head 100 also moves. In addition, the stage 11 can be inched as exemplified by the arrows 104 and 105, and in synchronization with the movement of the column 113, the desired region on the object 10 can be irradiated with the beam 116 emitted from the exposure head 100. The controller 200 is provided to control the movement of the exposure head 100 and that of the stage 11. In the exposure apparatus configurations exemplified in FIGS. 13A and 13B, it goes without saying that the desired region on the object 10 can be irradiated with the exit light 116 from the exposure head 100 according to particular movements of the stage 11 and table 111 with the column 113 fixed to the surface of the bed 110.

Figure 9:
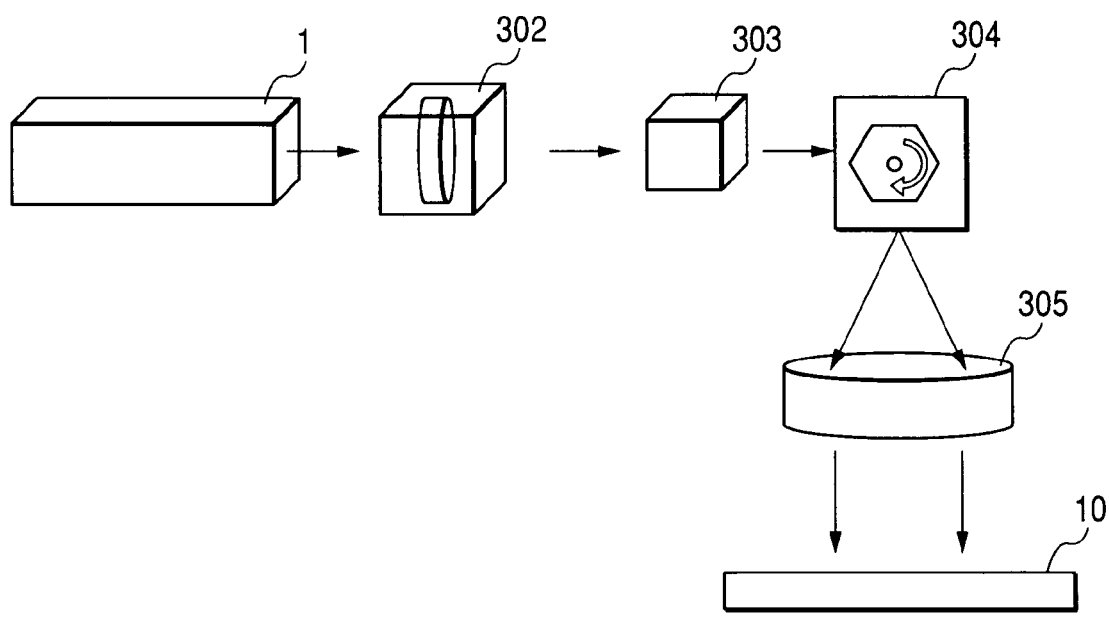
FIG. 9 is a schematic diagram showing a further embodiment of the exposure apparatus of the present invention.

Although the exposure head 100 described in FIGS. 13A and 13B can be optics including the first irradiation light source and second irradiation light source described in FIGS. 3 and 4, other examples are next described below using FIGS. 6 and 9.

Figure 6:
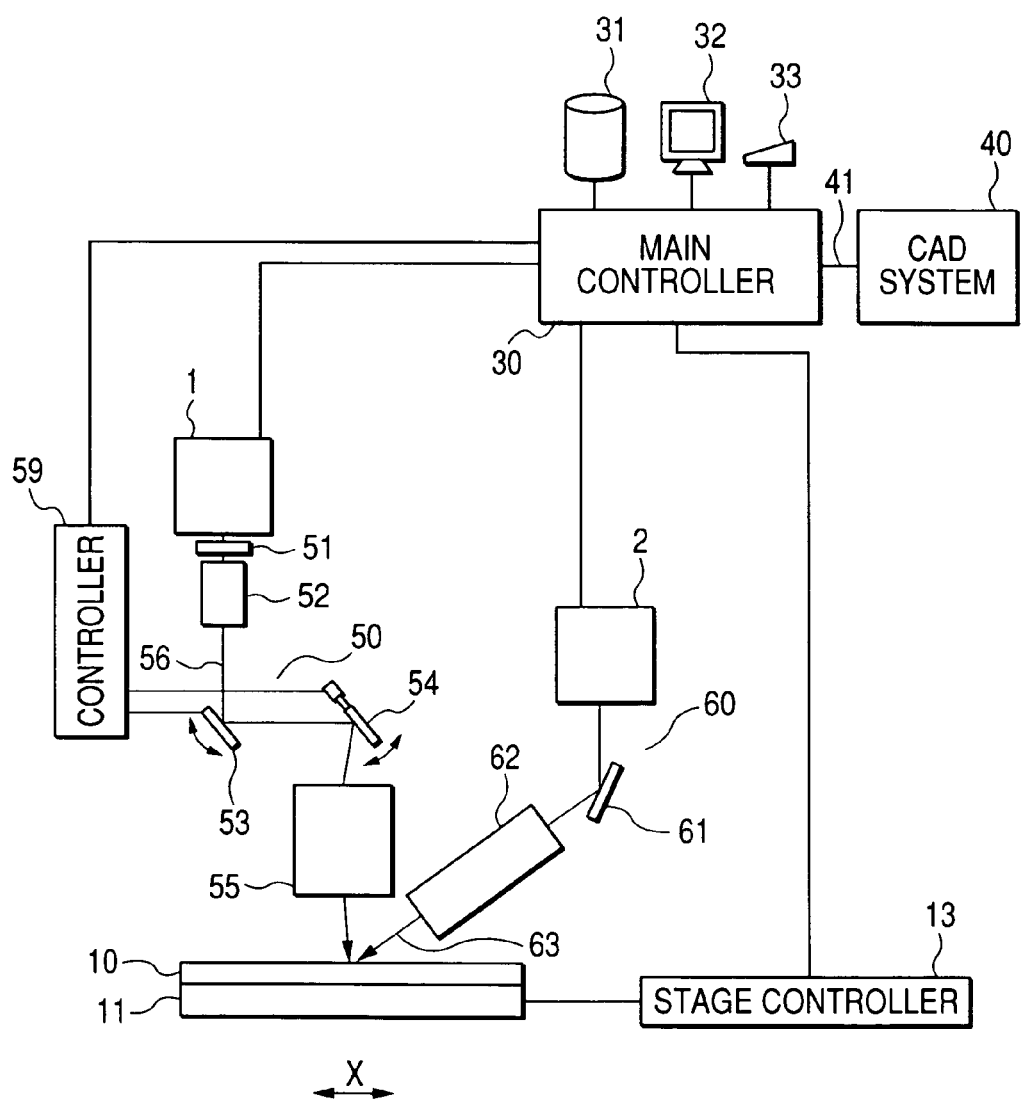
FIG. 6 is a schematic diagram showing yet another embodiment of the exposure apparatus of the present invention.

As shown in FIG. 6, another embodiment of the exposure apparatus according to the present invention agrees with the foregoing first embodiment in that the former embodiment includes a first irradiation light source 1, a second irradiation light source 2, a stage 11 on which to mount an object 10 to be exposed to light, and a stage controller 13 for controlling the stage 11. However, the above embodiment differs from the first embodiment in that a beam light source is used as the first irradiation light source 1 and in that beam-scanning optics is used as light modulation optics. While galvanometer-mirror optics 50 inclusive of a first direction control mirror 53 and a second direction control mirror 54 is shown as an example of the beam-scanning optics in FIG. 6, the optics 50 may be beam-scanning optics having a polygonal mirror and an f-θ lens in combination. In the exposure apparatus configurational example of FIG. 6, a beam 56 that has been emitted from the first irradiation light source 1 passes through a filter 51, an integrator 52, the first direction control mirror 53, the second direction control mirror 54, and imaging optics 55, and then reaches the object 10. A beam of light that has been emitted from the second irradiation light source 2 passes through a direction control mirror 61 and imaging optics 62 and then is irradiated to the object 10. A controller 59 is a device for specifying to various exposure units the kind of product to be manufactured according to a production schedule, and the quantity of products of the particular kind that are to be manufactured according to the production schedule. Next, another example of an optical system relating to the first irradiation light source of the exposure head 100 is described below using FIG. 9. FIG. 9 is a schematic view exemplifying a schematic configuration of beam-scanning optics which has a polygonal mirror 304 and an f-θ lens 305 in combination. In the exposure apparatus configurational example of FIG. 9, a YAG laser third-order higher-harmonic light source is used as the first irradiation light source 1, and a beam that has been emitted from the first irradiation light source 1 passes through illumination optics 302 and an acoustic optical device 303, then is scan-controlled by the polygonal mirror 304 and the f-θ lens 305, and reaches the object 10.

When highly accurate and rapid beam scanning is necessary, beam-scanning optics including a polygonal mirror and an f-θ lens generally tends to be preferred to galvanometer-mirror optics. Since the light modulation optics shown in FIGS. 6 and 9 as examples of use in the present embodiment has sufficiently high ultraviolet durability, a light source capable of emitting the energy rays that contain the ultraviolet light—near-ultraviolet light lying in the wavelength range 350-450 nm can be used as the first irradiation light source 1. More specifically, YAG third-order higher-harmonics, a semiconductor laser, or the like can be used. A beam that has been used for scanning with the scanning optics is converged on the surface of the object 10 via the imaging optics in order to form an image, as in the above embodiment. The beam is about 10 micrometers in minimum dimension. The object 10 is exposed while remaining mounted on planar stage 11, and is controlled via the stage controller 13 by main controller 30 so as to be operatively associated with the modulating operation of the beam-scanning optics. These movable sections are operatively associated to draw a desired pattern on the entire surface of the object 10.

In a region that has been irradiated for imaging with the exit beam from the first irradiation light source, an even larger region encompassing that region is exposed to the irradiation light emitted from the second irradiation light source 2. The second irradiation light source 2 can emit energy rays at intensity levels of 1% or more of all exit energy, but up to 100% thereof, wherein the energy rays contain the light falling under a category somewhere between ultraviolet light and near-ultraviolet light, with a wavelength from 350 to 450 nm. More specifically, a discharge lamp such as a metal halide lamp, low-pressure mercury lamp, ultrahigh-pressure mercury lamp, xenon lamp, or halogen lamp, or a laser light source such as a YAG third-order higher-harmonic laser or, a semiconductor laser can be used in a preferred fashion as the second irradiation light source 2 in the present invention. Most desirably, the second irradiation light source 2 is, for example, a semiconductor laser whose irradiation energy is easy to control, or a metal halide lamp that is inexpensive and whose maintenance is also easy. Depending on desired needs, one of the above light sources is selected with electric power consumption, maintenance and management, dosage controllability, and the like taken into consideration. The selection is conducted so that the integrated total amount of received light from the second irradiation light source 2 is uniform for each wavelength of the light.

Figure 7:
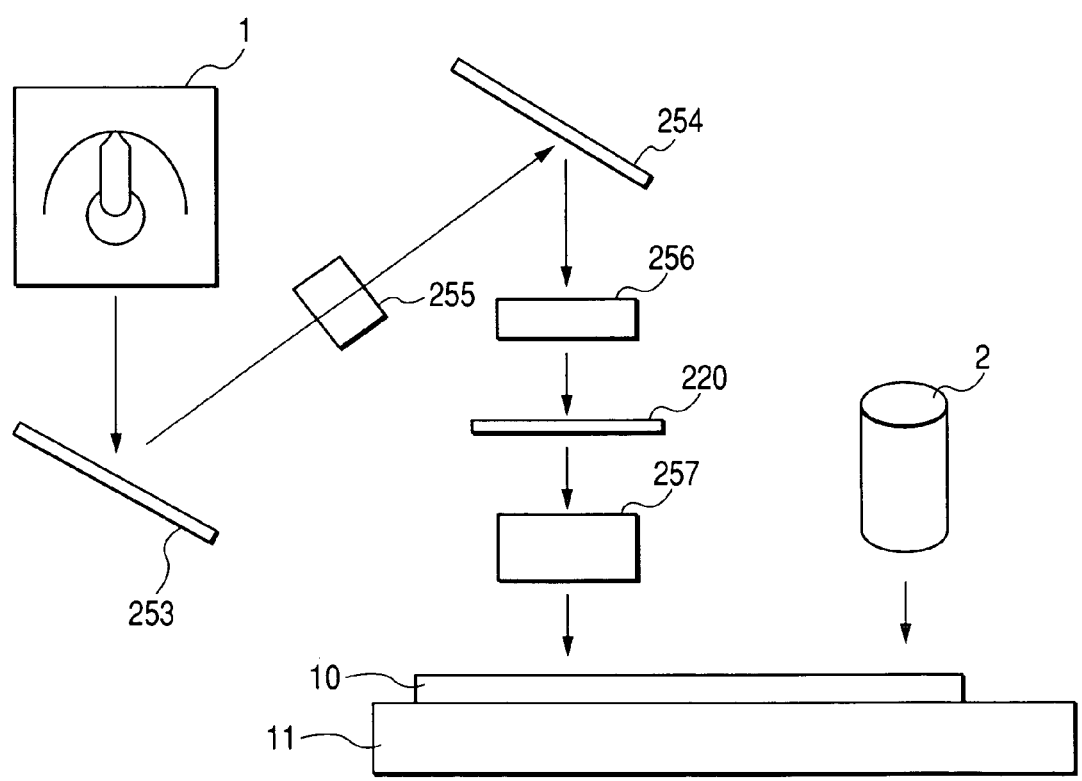
FIG. 7 is a schematic diagram showing a further embodiment of the exposure apparatus of the present invention.

Next, still another embodiment of an exposure apparatus according to the present invention is described below using FIG. 7. A difference from the exposure apparatus of the first embodiment exists in an optical system. Light that has been emitted from a first irradiation light source 1 is first passed through a first planar mirror 253, a second planar mirror 254, and an integrator provided between the mirrors 253 and 254, then passed through a photomask 220, and converted into a beam of a desired pattern shape. The first irradiation light source 1 in the present embodiment may be a light source capable of emitting the energy rays that contain the ultraviolet light—near-ultraviolet light lying in the wavelength range 350-450 nm. For the present embodiment, a configuration in which a condenser lens 256 and a projection lens 257 are provided respectively in front of and at rear of the photomask 220 in order to constitute imaging optics for forming an image is shown as an example in FIG. 7. Examples of the first irradiation light source 1 preferred in the present embodiment include an ultrahigh-pressure mercury lamp, a metal halide lamp, a xenon lamp, and the like. Similarly to the best embodiment described above, the light that has been converted into the beam of the desired pattern shape is converged on the surface of an object 10 to be exposed, the object 10 being mounted on a planar stage 11. In the present embodiment, although stage scanning for pattern drawing is not always necessary, stage scanning may be conducted with a view to making uniform the after-integrated total amount of light received from a second irradiation light source 2 for each wavelength of the light. Energy ray irradiation from the second irradiation light source 2 does not always need to be synchronous with selective pattern-imaging irradiation from the first irradiation light source 1. However, a time interval between the selective pattern-imaging irradiation from the first irradiation light source 1 and the energy ray irradiation from the second irradiation light source 2 is desirably short. According to study results of the present inventor, the most desirable time interval in the configuration of the present embodiment is 10 minutes or less, but since the kind, shape, and purpose of use of the object to be exposed (photosensitive material) permit the time interval to be even longer, it is desirable that a preferable time interval be confirmed in advance by appropriate experimentation.

As described above, the exposure apparatus in each foregoing embodiment employs the dual-light source system including the first irradiation light source 1 and the second irradiation light source 2. In terms of amounts-of-light integration, however, a multiple-exposure scheme with a single irradiation light source may be used to obtain essentially the same advantageous effects. For example, the first irradiation light source 1 may be activated to turn on the entire light modulation optics inclusive of a DMD and expose the entire surface of the object 10 under required conditions, and then the first irradiation light source 1 may be reactivated to turn part of the light modulation optics on and conduct pattern-drawing exposure of the whole-surface-exposed object 10 in that state.

Next, an embodiment that encompasses both an exposure method according to the present invention, and wiring-board manufacture using the exposure method, is described using FIGS. 8A-8I. First, as shown in FIG. 8A, a desired object 10 of a required shape is set up for exposure and a photosensitive material is coated into a film form on the surface of the object 10. In the embodiment of FIGS. 8A-8I, a copper-covered glass epoxy board that includes both a glass epoxy base material 10a for a wiring board, and a copper foil 10b coated into film form on the surface of the base material 10a beforehand, is used and a material for lithographic processing during manufacture of wiring boards is used as a photosensitive material 10c film-coated on the surface of the copper foil 10b. The present invention can also be applied to combinations other than those of the materials exemplified in FIGS. 8A-8I. For example, the present invention is also applicable to an exposure process for a solder resist layer which has already been coated on the surface of a multilayered wiring board having a wiring layer on an inner layer and outermost layer thereof. In addition, the present invention is applicable to other pattern-forming processes, for example, mold manufacture during stereo-lithography. The object 10 to be exposed and the photosensitive material to be film-coated on the surface thereof have the respective kinds and shapes properly selected according to particular needs. An approximate film thickness of the as-coated photosensitive material preferred in the present invention ranges from 2 to 100 micrometers. A material with a thinner film is suitable for finer processing, and a minimum allowable processing dimension (line width) is about 1 micrometer.

Figure 8:
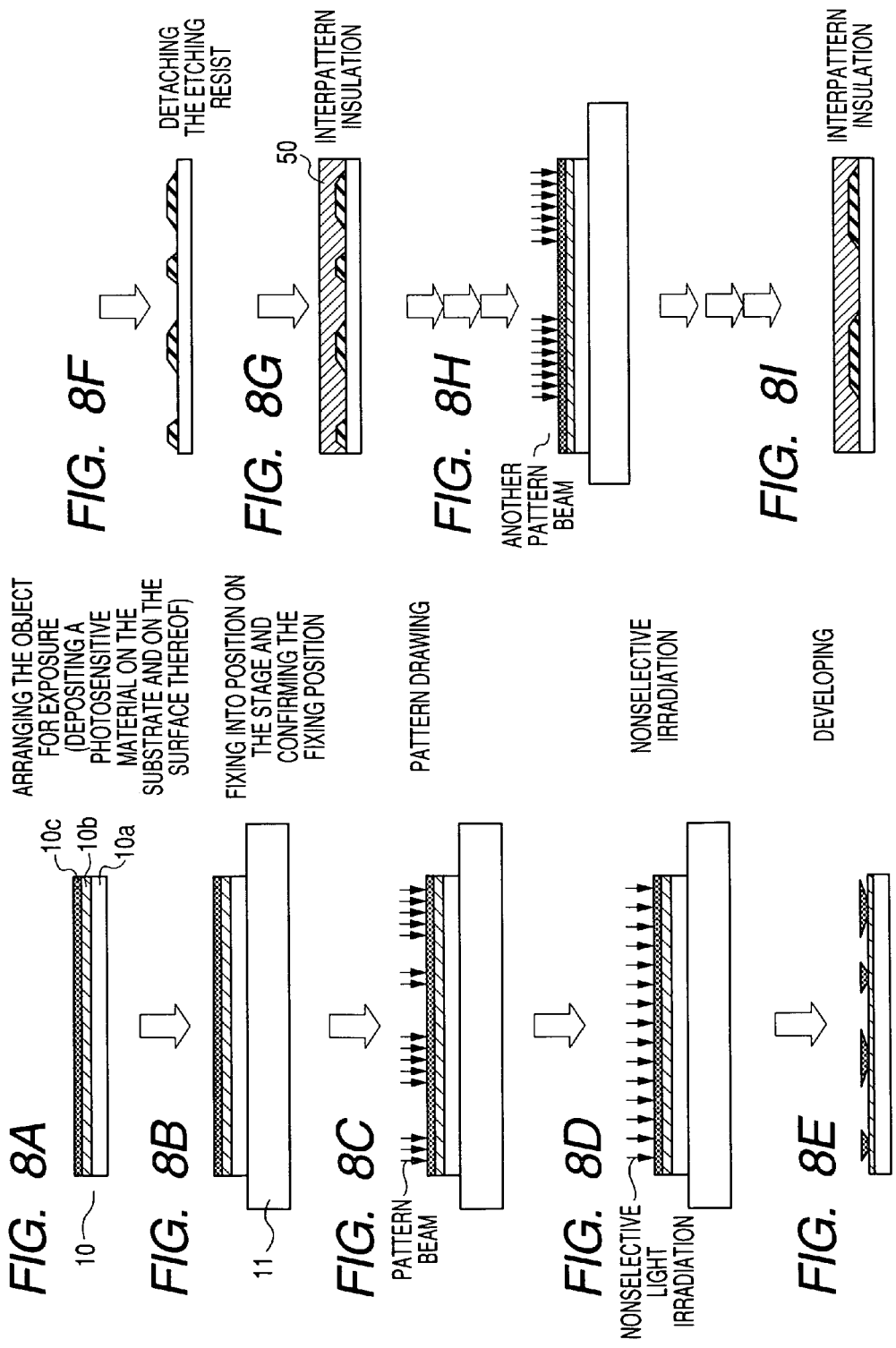
FIGS. 8A-8I are schematic diagrams showing an embodiment of a pattern-forming method according to the present invention.

As shown in FIG. 8B, the object 10 with the photosensitive material film-coated on the surface is disposed on stage 11 of the exposure apparatus in next process step. While the present embodiment uses the exposure apparatus exemplified in FIG. 3, the kind of exposure apparatus to be used is not limited to the exposure apparatus of FIG. 3 and an exposure apparatus appropriate for a particular purpose, for example, the exposure apparatus exemplified in FIG. 6 or 7 may be selected or the exposure apparatus of the configuration exemplified in FIGS. 13A and 13B may be selected. The object 10 is moved onto the stage 11 by using a suitable conveying device such as a board handler (not shown), and then the object 10 is fixed to a required position on the stage. Such planar object 10 as exemplified in FIG. 8 can be fixed in a simplified and reliable form by using an electrostatic chuck, a vacuum chuck, or any other fixing method (not shown).

Marks in a predetermined shape are provided in a plurality of places on the object 10 fixed to the surface of the stage 11, and a measuring element of the exposure apparatus in the present invention measures a position, shape, size, and other factors of each mark (not shown). The position of the object 10 on the stage 11 is derived from the measurement results that the measuring element has acquired. An arithmetic processor of the exposure apparatus in the present invention compares the measurement results and the predetermined data stored within a storage device 31 after being transmitted from a CAD system, and calculates the correction data required for fine adjustment of the movements of the light modulation optics 5 and the stage 11. The required data within the storage device 31 is pattern data to be drawn, and the pattern data is provided with correction based on the correction data that has been calculated in the above process step. After the correction, the pattern data is distributed to both a modulation controller 9 and a stage controller 13, and then used for interactive control between the modulation optics 5 and the stage 11 during pattern drawing that follows as a next process step.

In the next process step, the object 10 fixed to the surface of the stage 11 receives the light that has been modulated by the modulation optics 5, and a pattern is drawn on the surface of the object 10, as shown in FIG. 8C. In the present invention, nonselective energy ray irradiation, in addition to position-selective pattern drawing, is conducted so that the region subjected to nonselective energy ray irradiation will encompass the region subjected to pattern drawing. It is desirable that the energy rays used for this operation be rays that contain the light falling under a category somewhere between ultraviolet light and near-ultraviolet light, in the wavelength range 350 to 450 nm, at intensity levels of 1% or more of all exit energy, but up to 100% thereof. Irradiation with the energy rays may be conducted so that an associated region is superimposed on the pattern-drawing region. Alternatively, the energy ray irradiation may precede or follow pattern drawing. The present inventor experimentally verified that a sum of a position-selective pattern drawing dosage and a nonselective whole-surface energy ray dosage can be the same as or smaller than the dosage applied during pattern forming only with position-selective pattern drawing. A more specific example is shown next. Although 200 mJ/cm$^2$ is needed to obtain a nondefective desired pattern only by position-selective pattern drawing, an equivalent nondefective pattern can likewise be formed by combining 20 mJ/cm$^2$ selective pattern drawing and 20 mJ/cm$^2$ nonselective whole-surface energy ray irradiation. It cannot be said that this experimental result is completely accounted for, but the present inventor considers this result to be due to one kind of reciprocity law failure. It is conjectured that the irradiation for drawing the pattern was split to appear such reciprocity law failure, resulting in the desired reaction having been induced in the photosensitive material at a dosage level lower than that expected. In FIGS. 8A-8I, an example of conducting the nonselective irradiation process step after pattern drawing has been conducted (see FIG. 8D).

Since nonselective irradiation does not require position matching, nonselective irradiation can be easily executed when the position of the object 10 is not fixed or when the object is moving. More specifically, the irradiation may be conducted between transfer of the object 10 to the stage 11 and the fixing of the object. Otherwise, the irradiation may be conducted during observation of the marks of the prescribed shape on the object 10 or may be conducted during calculation of correction coefficients. In the present invention, throughput can be increased by conducting nonselective irradiation concurrently with the above processes.

The pattern-drawn object 10 is unloaded from the exposure apparatus and then undergoes predetermined developing to fix the pattern, as shown in FIG. 8E. FIGS. 8A-8I show an example of a schematic process diagram for wiring-pattern forming with a negative-type etching resist, and at the phase of FIG. 8E, an etching resist pattern is formed on the surface of the object 10.

In next process step, a conductor is etched with the above etching resist pattern as a mold, and the etching resist portions that have become unnecessary are removed under predetermined treating conditions. FIG. 8F shows a schematic cross-sectional structure of the object 10 from which the resist was removed. As shown in FIG. 8F, there is a tendency that conductor processing by etching generally results in the conductor easily becoming trapezoidal in cross section. Forming a conductor pattern by plating a mold formed of a plating resist, not by etching, tends to make the conductor easily become inverse-trapezoidal in cross section.

Before the conductor pattern is used as wiring, a wiring coverlayer 80 is overlaid to provide interpattern insulation and to protect the wiring from external force. FIG. 8G is a schematic sectional of a conductor pattern over which the coverlayer 80 is formed.

After the process of FIG. 8E, since the first object (board) that was initially treated is already unloaded from the exposure apparatus, the next board is loaded and the same process steps as above are repeated to manufacture a next wiring board (second object to be exposed). Although a shape of the selective pattern drawn on the second object can be the same as that of the pattern which was drawn on the first object, the shape of the selective pattern drawn on the second object does not always need to be the same, and a pattern specified according to a particular production schedule or demand change is desirably drawn. FIG. 8H shows an example of pattern drawing with the light that the second object receives during a process step equivalent to FIG. 8C when a pattern different from that of the first object is to be drawn.

Figure 10A:
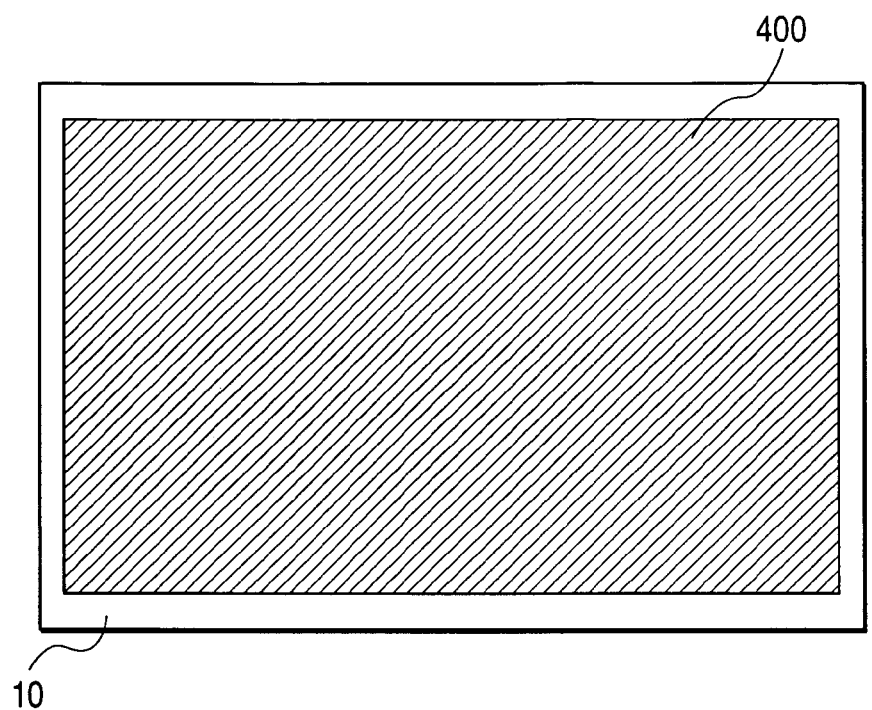
FIGS. 10A and 10B are schematic diagrams showing an embodiment of an irradiation position according to the present invention.
Figure 10B:
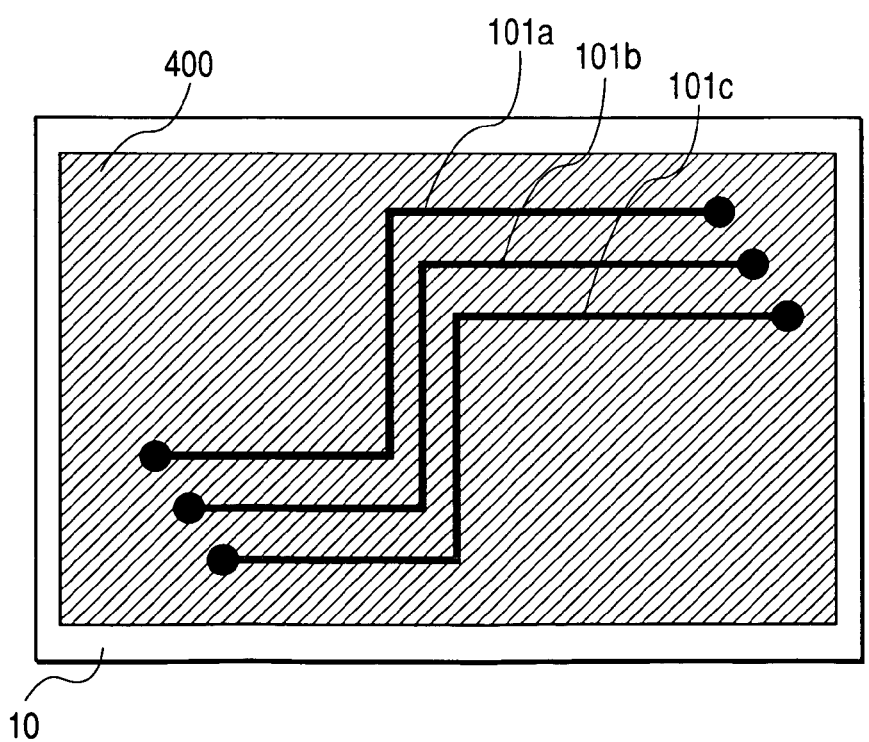
Figure 11A:
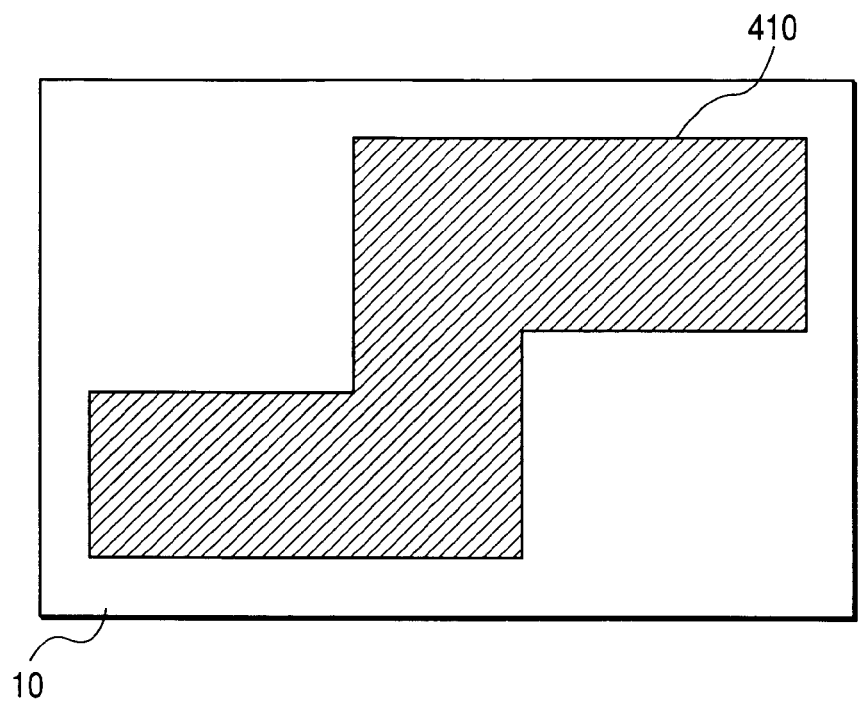
FIGS. 11A and 11B are schematic diagrams showing another embodiment of an irradiation position according to the present invention.
Figure 11B:
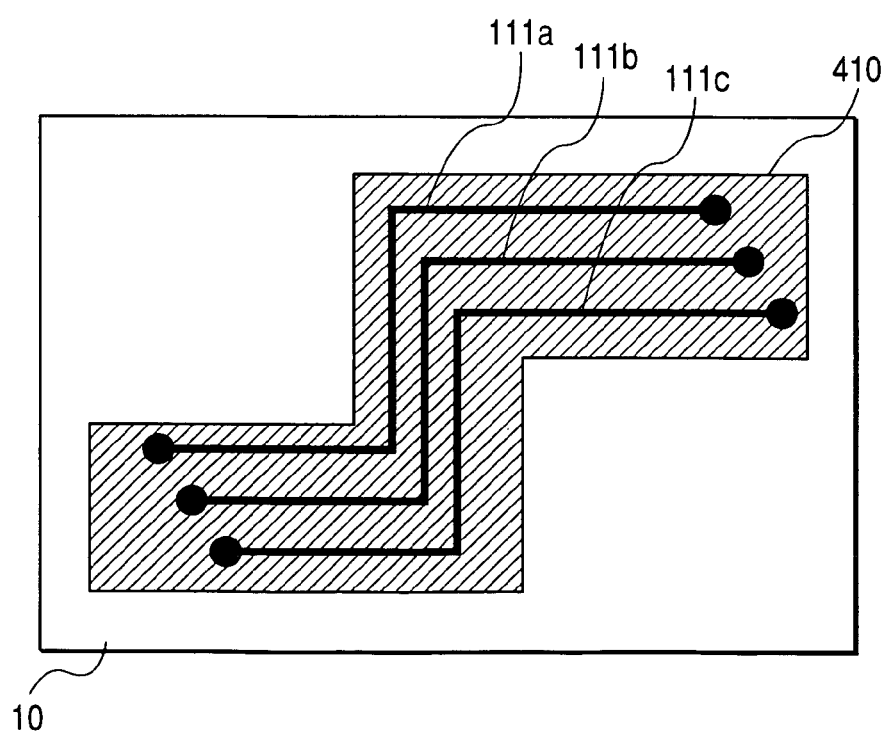

FIGS. 10A and 10B are schematic top views of the region irradiated with light during the above pattern-drawing process. The region 400 is a region subjected to nonselective whole-surface energy ray irradiation, and inside the region, there are portions 101a, 101b, 101c that become patterns. As shown in FIG. 10A, the region 400 may be irradiated before the pattern portions 101a, 101b, 101c are irradiated, or conversely as shown in FIG. 10B, the pattern portions 101a, 101b, and 101c may be irradiated prior to irradiation of the region 400. FIGS. 11A, 11B show an embodiment in which slight limitations are provided in a nonselective energy ray irradiation region, and internally to the wide region 410 irradiated with energy rays, there are portions 111a, 111b, and 111c that finally become patterns. As shown in FIG. 11A, the region 410 may be irradiated before the pattern portions 111a, 111b, 111c are irradiated, or conversely as shown in FIG. 11B, the pattern portions 111a, 111b, and 111c may be irradiated prior to irradiation of the region 410.

According to the embodiments described above, it is possible to realize high-throughput pattern drawing that breaks through the limits of light source luminance enhancement intended to improve throughput in pattern drawing.

What is claimed is:

1. An exposure method for processing a photosensitive material by irradiating, with a beam of light that has been processed into a pattern shape, the surface of an object to the exposed to light, which object includes said photosensitive material, and then developing the photosensitive material, the exposure method comprising:

a first exposure step for exposing and processing said photosensitive material by irradiating said photosensitive material with a position-selective beam of near-ultraviolet light at a wavelength of about 405 nm to form said pattern shape;

a second exposure step for suppressing occurrence of a reciprocity law failure during said first exposure step to thereby reduce overall exposure time required during the first exposure step comprising irradiating with a non-position-selective energy ray which is in wavelength range of 350 to 450 nm and having an irradiation area which includes a region irradiated during said first exposure step;

wherein said second exposure step is executed one of before said first exposure step, at the same time of as said first exposure step, and after said first exposure step.

2. The exposure method according to claim 1, wherein the irradiation area of the second exposure step is greater than an irradiation area of the first exposure step.

* * * * *